(12) United States Patent
Zhou

(10) Patent No.: US 9,141,497 B2
(45) Date of Patent: Sep. 22, 2015

(54) LOAD-TESTING CIRCUIT FOR USB PORTS

(71) Applicant: ShenZhen Goldsun Network Intelligence Technology Co. Ltd., ShenZhen (CN)

(72) Inventor: Hai-Qing Zhou, Shenzhen (CN)

(73) Assignee: ShenZhen Goldsun Network Intelligence Technology Co., Ltd., ShenZhen (CN)

( * ) Notice: Subject to any disclaimer, the term of this patent is extended or adjusted under 35 U.S.C. 154(b) by 12 days.

(21) Appl. No.: 14/162,751

(22) Filed: Jan. 24, 2014

(65) Prior Publication Data

US 2014/0218047 A1    Aug. 7, 2014

(30) Foreign Application Priority Data

Feb. 4, 2013    (CN) .......................... 2013 1 0044390

(51) Int. Cl.
| | | |
|---|---|---|
| G01R 31/04 | (2006.01) |
| H03K 17/60 | (2006.01) |
| G06F 11/22 | (2006.01) |
| G06F 11/24 | (2006.01) |

(52) U.S. Cl.
CPC .............. *G06F 11/221* (2013.01); *G06F 11/24* (2013.01)

(58) Field of Classification Search
CPC ............................... G06F 11/24; G06F 11/221
See application file for complete search history.

(56) References Cited

U.S. PATENT DOCUMENTS

2010/0141266 A1 * 6/2010 Cui et al. ...................... 324/538

* cited by examiner

*Primary Examiner* — Melissa Koval
*Assistant Examiner* — Farhana Hoque
(74) *Attorney, Agent, or Firm* — Novak Druce Connoll Bove + Quigg LLP

(57) ABSTRACT

A load-testing circuit is used for simulating maximum standard load currents for different types of USB ports. The load-testing circuit includes a first electronic switch, a second electronic switch, and a current selection module including a plurality of current branch circuits. When one of the current branch circuits is activated, a voltage at a third terminal of the first electronic switch is supplied to a first terminal of the second electronic switch through the activated current branch circuit to turn on the second electronic switch. A current of the third terminal of the first electronic switch is approximately equal to a current of the activated current branch circuit.

16 Claims, 1 Drawing Sheet

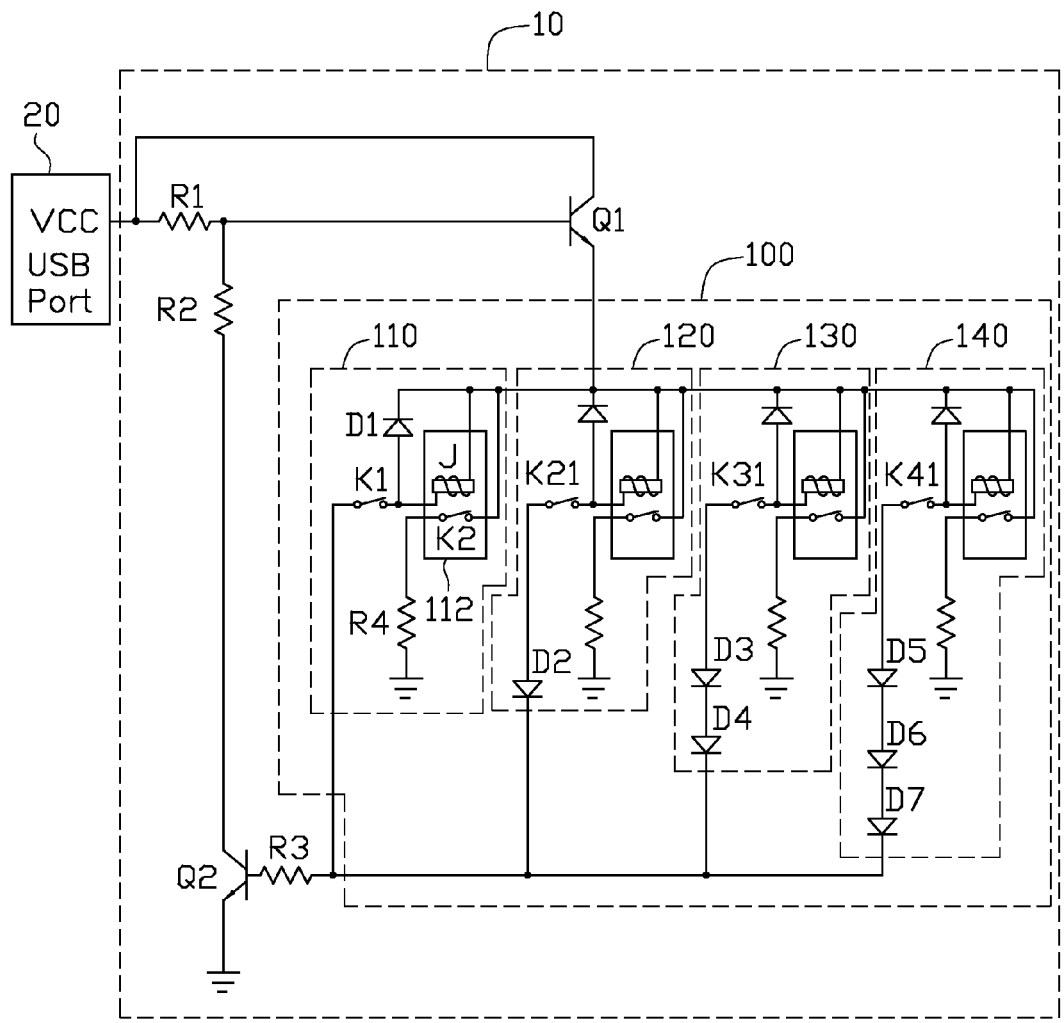

LOAD-TESTING CIRCUIT FOR USB PORTS

BACKGROUND

1. Technical Field

The present disclosure relates to load-testing circuits, and particularly to a load-testing circuit for USB ports.

2. Description of Related Art

USB ports include four different types, such as type 1.0, type 1.1, type 2.0, and type 3.0. The maximum standard load currents of the USB ports respectively are 100 mA, 150 mA, 500 mA, and 900 mA. Typically, one load-testing circuit can simulate only one maximum standard load current. As a result, different load-testing circuits must be designed for different types of USB ports, which is inconvenient and costly.

BRIEF DESCRIPTION OF THE DRAWING

Many aspects of the present disclosure can be better understood with reference to the following drawing. The components in the drawing are not necessarily drawn to scale, the emphasis instead being placed upon clearly illustrating the principles of the present embodiments.

The FIGURE is a circuit diagram of a load-testing circuit in accordance with an embodiment of the present disclosure.

DETAILED DESCRIPTION

The disclosure, including the accompanying drawing, is illustrated by way of example and not by way of limitation. It should be noted that references to "an" or "one" embodiment in this disclosure are not necessarily to the same embodiment, and such references can mean "at least one."

The figure shows an embodiment of a load-testing circuit 10 used for simulating maximum standard load currents for different types of USB ports 20 when the USB ports 20 are under test. The load-testing circuit 10 comprises a first electronic switch Q1, a second electronic switch Q2, a current selection module 100, and three resistors R1-R3.

Each USB port 20 comprises a power terminal VCC. Each of the first electronic switch Q1 and the second electronic switch Q2 comprises a first terminal, a second terminal, and a third terminal. The first terminal of the first electronic switch Q1 is electrically connected to the power terminal VCC through the resistor R1. The second terminal of the first electronic switch Q1 is electrically connected to the power terminal VCC. The third terminal of the first electronic switch Q1 is electrically connected to the current selection module 100. The first terminal of the second electronic switch Q2 is electrically connected to the current selection module 100 through the resistor R3. The second terminal of the second electronic switch Q2 is electrically connected to the first terminal of the first electronic switch Q1 through the resistor R2. In one embodiment, the power terminal VCC of the USB port 20 supplies a 5 volts voltage to the first the terminal of the first electronic switch Q1 and the first electronic switch Q is maintained in the turned on state.

The current selection module 100 comprises a first current branch circuit 110, a second current branch circuit 120, a third current branch circuit 130, and a fourth current branch circuit 140. Each current branch circuit comprises a relay 112, a first switch K1, a first diode D1, and a resistor R4. The relay 112 comprises a coil J and a second switch K2. A first terminal of the coil J is electrically connected to the third terminal of the first electronic switch Q1. A second terminal of the coil J is electrically connected to a first terminal of the first switch K1.

A second terminal of the first switch K1 is electrically connected to the first terminal of the second electronic switch Q2 through the resistor R3. A first terminal of the second switch K2 is electrically connected to the third terminal of the first electronic switch Q1. A second terminal of the second switch K2 is grounded through the resistor R4. An anode of the first diode D1 is electrically connected to the second terminal of the coil J. A cathode of the first diode D1 is electrically connected to the third terminal of the first terminal of the coil J. In one embodiment, the first diode D1 is used for discharging electrical energy stored in the coil J. A resistance of the resistor R4 of each current branch circuit is different.

The second current branch circuit 120 further comprises a second diode D2. An anode of the second diode D2 is electrically connected to the second terminal of the first switch K21 of the second current branch circuit 120. A cathode of the second diode D2 is electrically connected to the first terminal of the second electronic switch Q2 though the resistor R3. The third current branch circuit 130 further comprises a third diode D3 and a fourth diode D4. An anode of the third diode D3 is electrically connected to the second terminal of the first switch K31 of the third current branch circuit 130. A cathode of the third diode D3 is electrically connected to an anode of the fourth diode D4. A cathode of the fourth diode D4 is electrically connected to the first terminal of the second electronic switch Q2 though the resistor R3. The fourth current branch circuit 140 further comprises a fifth diode D5, a sixth diode D6, and a seventh diode D7. An anode of the fifth diode D5 is electrically connected to the second terminal of the first switch K41 of the fourth current branch circuit 140. A cathode of the fifth diode D5 is electrically connected to an anode of the sixth diode D6. A cathode of the sixth diode D6 is electrically connected to an anode of the seventh diode D7. A cathode of the seventh diode D7 is electrically connected to the first terminal of the second electronic switch Q2 though the resistor R3.

When the first switch K1 of the first current branch circuit 110 is turned on, the first current branch circuit 110 is activated. In the relay 112 of the first current branch circuit 110, a current passes through the coil J, and thus the second switch K2 is turned on. A voltage at the third terminal of the first electronic switch Q1 is supplied to the first terminal of the second electronic switch Q2 through the coil J, the first switch K1, and the resistor R3 in that order. The second electronic switch Q2 is turned on. A voltage of the resistor R4 of the first current branch circuit 110 is approximately equal to a sum of a voltage at the first terminal of the second electronic switch Q2 and a voltage of the resistor R3. A current of the resistor R4 of the first current branch circuit 110 is equal to the voltage of the resistor R4 of the first current branch circuit 110 divided by a resistance of the resistor R4 of the first current branch circuit 110. In one embodiment, when the second electronic switch Q2 is turned on, the voltage at the first terminal of the second electronic switch is approximately equal to 0.7V. A resistance of the resistor R3 is very large, and thus a current of the resistor R3 is small and can be negligible. In this state, a current of the third terminal of the first electronic switch Q1 is approximately equal to the current of the resistor R4 of the first current branch circuit 110.

When the first switch K21 of the second current branch circuit 120 is turned on, the second current branch circuit 120 is activated. In the relay 112 of the second current branch circuit 120, a current passes through the coil J, and thus the second switch K2 is turned on. The voltage at the third terminal of the first electronic switch Q1 is supplied to the first terminal of the second electronic switch Q2 through the coil J, the first switch K21, the second diode D2, and the resistor R3 in that order. The second electronic switch Q2 is turned on. A voltage of the resistor R4 of the second current branch circuit 120 is approximately equal to a sum of the voltage at the first terminal of the second electronic switch Q2, the voltage of the resistor R3, and a voltage of the second diode D2. A current of the resistor R4 of the second current branch circuit 120 is equal to the voltage of the resistor R4 of the second current branch circuit 120 divided by a resistance of the resistor R4 of the second current branch circuit 120. In this state, the current of the third terminal of the first electronic switch Q1 is approximately equal to the current of the resistor R4 of the second current branch circuit 120.

When the first switch K31 of the third current branch circuit 130 is turned on, the third current branch circuit 130 is activated. In the relay 112 of the third current branch circuit 130, a current passes through the coil J, and thus the second switch K2 is turned on. The voltage at the third terminal of the first electronic switch Q1 is supplied to the first terminal of the second electronic switch Q2 through the coil J, the first switch K31, the third diode D3, the fourth diode D4, and the resistor R3 in that order. The second electronic switch Q2 is turned on. A voltage of the resistor R4 of the third current branch circuit 130 is approximately equal to a sum of the voltage at the first terminal of the second electronic switch Q2, the voltage of the resistor R3, a voltage of the third diode D3, and a voltage of the fourth diode D4. A current of the resistor R4 of the third current branch circuit 130 is equal to the voltage of the resistor R4 of the third current branch circuit 130 divided by a resistance of the resistor R4 of the third current branch circuit 130. In this state, the current of the third terminal of the first electronic switch Q1 is approximately equal to the current of the resistor R4 of the third current branch circuit 130.

When the first switch K41 of the fourth current branch circuit 140 is turned on, the fourth current branch circuit 140 is activated. In the relay 112 of the fourth current branch circuit 140, a current passes through the coil J, and thus the second switch K2 is turned on. The voltage at the third terminal of the first electronic switch Q1 is supplied to the first terminal of the second electronic switch Q2 through the coil J, the first switch K41, the fifth diode D5, the sixth diode D6, the seventh diode D7, and the resistor R3 in that order. The second electronic switch Q2 is turned on. A voltage of the resistor R4 of the fourth current branch circuit 140 is approximately equal to a sum of the voltage at the first terminal of the second electronic switch Q2, the voltage of the resistor R3, a voltage of the fifth diode D5, a voltage of the sixth diode D6, and a voltage of the seventh diode D7. A current of the resistor R4 of the fourth current branch circuit 140 is equal to the voltage of the resistor R4 of the fourth current branch circuit 140 divided by a resistance of the resistor R4 of the fourth current branch circuit 140. In this state, the current of the third terminal of the first electronic switch Q1 is approximately equal to the current of the resistor R4 of fourth current branch circuit 140.

In one embodiment, when the first current branch circuit 110 is activated, the current of the third terminal of the first electronic switch Q1 is approximately equal to 100 mA. When the second current branch circuit 120 is activated, the current of the third terminal of the first electronic switch Q1 is approximately equal to 150 mA. When the third current branch circuit 130 is activated, the current of the third terminal of the first electronic switch Q1 is approximately equal to 500 mA. When the fourth current branch circuit 140 is activated, the current of the third terminal of the first electronic switch Q1 is approximately equal to 900 mA.

In one embodiment, each of the first electronic switch Q1 and the second electronic switch Q2 is an npn-type bipolar junction transistor (BJT), and the first terminal, the second terminal, and the third terminal of each of the first electronic switch Q1 and the second electronic switch Q2 respectively correspond to a base, a collector, and an emitter of the npn-type BJT. Each of the resistors R1 and R3 is a current-limiting resistor, and the resistor R2 is a voltage-dividing resistor. Because a current of the emitter of the npn-type BJT is approximately equal to a sum of a current of the base of the npn-type BJT and a current of the collector of the npn-type BJT according to current characteristics of the npn-type BJT, and a current of the power terminal VCC is approximately equal to a sum of a current of the first of the electronic switch Q1 and the second terminal of the first electronic switch Q1, the current of the power terminal VCC is approximately equal to the current of the third terminal of the first electronic switch Q1. In other embodiments, each of the first electronic switch Q1 and the second electronic switch Q2 may be an n-channel metal-oxide semiconductor field-effect transistor (NMOS-FET), or other switch having similar functions. The number of the current branch circuits of the current selection module 100 and the number of the diodes of each current branch circuit can be adjusted according to actual need.

Even though numerous characteristics and advantages of the disclosure have been set forth in the foregoing description, together with details of the structure and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

The invention claimed is:

1. A load-testing circuit to simulate maximum standard load currents for different types of USB ports, each type of USB port comprising a power terminal, the load-testing circuit comprising:
   a first resistor, a second resistor, and a third resistor;
   a current selection module comprising a plurality of current branch circuits;
   a first electronic switch comprising a first terminal electrically connected to the power terminal through the first resistor, a second terminal electrically connected to the power terminal, and a third terminal electrically connected to each current branch circuit; and
   a second electronic switch comprising a first terminal electrically connected to each current branch circuit through the second resistor, a second terminal electrically connected to the first terminal of the first electronic switch through the third resistor, and a third terminal grounded;
   wherein in response to one of the current branch circuit being activated, a voltage at the third terminal of the first electronic switch is supplied to the first terminal of the second electronic switch through the activated current branch circuit and the second resistor in that order to turn on the second electronic switch, and a current of the third terminal of the first electronic switch is approximately equal to a current of the activated current branch circuit.

2. The load-testing circuit of claim 1, wherein each current branch circuit comprises:
   a fourth resistor;
   a first switch comprising a first terminal and a second terminal electrically connected to the first terminal of the second electronic switch through the second resistor; and a relay comprising:
  a coil comprising a first terminal electrically connected to the third terminal of the first electronic switch, and a second terminal electrically connected to the first terminal of the first switch; and
  a second switch comprising a first terminal electrically connected to the third terminal of the first electronic switch, and a second terminal grounded through the fourth resistor;
wherein in response to the first switch of one of current branch circuits being turned on, the one of current branch circuits is activated, a current pass through the coil, the second switch is turned on, a voltage at the third terminal of the first electronic switch is supplied to the first terminal of the second electronic switch through the coil, the first switch, and the second resistor in that order to turn on the second electronic switch, and the current of the third terminal of the first electronic switch is approximately equal to a current of the fourth resistor of the activated current branch circuit.

3. The load-testing circuit of claim 2, wherein the current selection module comprises a first current branch circuit, a second current branch circuit, a third current branch circuit, and a fourth current branch circuit; the second current branch circuit further comprises a first diode, the first diode comprise an anode electrically connected to the second terminal of the first switch of the second current branch circuit and a cathode electrically connected to the first terminal of the second electronic switch through the second resistor; the third current branch circuit further comprises a second diode and a third diode, the second diode comprises an anode electrically connected to the second terminal of the first switch of the third current branch circuit and a cathode, the third diode comprises an anode electrically connected to the cathode of the second diode and a cathode electrically connected to the first terminal of the second electronic switch through the second resistor; the fourth current branch circuit further comprises a fourth diode, a fifth diode, and a sixth diode, the fourth diode comprises an anode electrically connected to the second terminal of the first switch of the fourth current branch circuit and a cathode, the fifth diode comprises an anode electrically connected to the cathode of the fourth diode and a cathode, the sixth diode comprises an anode electrically connected to the cathode of the fifth diode and a cathode electrically connected to the first terminal of the second electronic switch through the second resistor.

4. The load-testing circuit of claim 3, wherein when the first switch of the first current branch circuit is turned on, the first current branch circuit is activated, a voltage of the fourth resistor of the first current branch circuit is approximately equal to a sum of a voltage at the first terminal of the second electronic switch and a voltage of the second resistor, and the current of the third terminal of the first electronic switch is approximately equal to a current of the fourth resistor of the first current branch circuit; when the first switch of the second current branch circuit is turned on, the second current branch circuit is activated, the first diode is turned on, a voltage of the fourth resistor of the second current branch circuit is approximately equal to a sum of the voltage at the first terminal of the second electronic switch, the voltage of the second resistor, and a voltage of the first diode, and the current of the third terminal of the first electronic switch is approximately equal to a current of the fourth resistor of the second current branch circuit; when the first switch of the third current branch circuit is turned on, the third current branch circuit is activated, the second diode and the third diode are turned on, a voltage of the fourth resistor of the third current branch circuit is approximately equal to a sum of the voltage at the first terminal of the second electronic switch, the voltage of the second resistor, a voltage of the second diode, and a voltage of the third diode, and the current of the third terminal of the first electronic switch is approximately equal to a current of the fourth resistor of the third current branch circuit; when the first switch of the fourth current branch circuit is turned on, the fourth current branch circuit is activated, the fourth diode, the fifth diode, and the sixth diode are turned on, a voltage of the fourth resistor of the fourth current branch circuit is approximately equal to a sum of the voltage at the first terminal of the second electronic switch, the voltage of the second resistor, a voltage of the fourth diode, a voltage of the fifth diode, and a voltage of the sixth diode, and the current of the third terminal of the first electronic switch is approximately equal to a current of the fourth resistor of the fourth current branch circuit.

5. The load-testing circuit of claim 2, wherein each current branch circuit further comprises a seventh diode comprising an anode electrically connected to the second terminal of the coil and a cathode electrically connected to the first terminal of the coil, the seventh diode discharges electrical energy stored in the coil.

6. The load-testing circuit of claim 2, wherein a resistance of the fourth resistor of each current branch circuit is different.

7. The load-testing circuit of claim 1, wherein each of the first electronic switch and the second electronic switch is an npn-type bipolar junction transistor (BJT), and the first terminal, the second terminal, and the third terminal of each of the first electronic switch and the second electronic switch respectively corresponding to a base, a collector, and an emitter of the npn-type BJT.

8. The load-testing circuit of claim 1, wherein each of the first resistor and the second resistor is a current-limiting resistor, and the third resistor is a voltage-dividing resistor.

9. A load-testing circuit to simulate maximum standard load currents for different types of USB ports, each type of USB port comprising a power terminal, the load-testing circuit comprising:
  a first resistor, a second resistor, and a third resistor;
  a first electronic switch comprising a first terminal electrically connected to the power terminal through the first resistor, a second terminal electrically connected to the power terminal, and a third terminal;
  a second electronic switch comprising a first terminal, a second terminal electrically connected to the first terminal of the first electronic switch through the second resistor, and a third terminal grounded;
  a first current branch circuit comprising:
    a fourth resistor;
    a first switch comprising a first terminal and a second terminal electrically connected to the first terminal of the second electronic switch through the third resistor; and
    a first relay comprising a first coil comprising a first terminal electrically connected to the third terminal of the first electronic switch and a second terminal electrically connected to the first terminal of the first switch, and a second switch comprising a first terminal electrically connected to the third terminal of the first electronic switch and a second terminal grounded through the fourth resistor; and a second current branch circuit comprising:
  a fifth resistor;
  a first diode comprising an anode and a cathode electrically connected to the first terminal of the second electronic switch through the third resistor;
  a third switch comprising a first terminal and a second terminal electrically connected to the anode of the first diode; and
  a second relay comprising a second coil comprising a first terminal electrically connected to the third terminal of the first electronic switch and a second terminal electrically connected to the first terminal of the third switch, and a fourth switch comprising a first terminal electrically connected to the third terminal of the first electronic switch and a second terminal grounded through the fifth resistor;
wherein in response to the first switch being turned on, the first current branch circuit is activated, a current passes through the first coil, the second switch is turned on, a voltage at the third terminal of the first electronic switch is supplied to the first terminal of the second electronic switch through the first coil, the first switch, and the third resistor in that order to turn on the second electronic switch, a voltage of the fourth resistor is approximately equal to a sum of a voltage at the first terminal of the second electronic switch and a voltage of the third resistor, and a current of the third terminal of the first electronic switch is approximately equal to a current of the fourth resistor; and
wherein in response to the third switch being turned on, the second current branch circuit is activated, the first diode is turned on, a current passes through the second coil, the fourth switch is turned on, a voltage at the third terminal of the first electronic switch is supplied to the first terminal of the second electronic switch through the second coil, the third switch, the first diode, and the third resistor in that order to turn on the second electronic switch, a voltage of the fifth resistor is approximately equal to a sum of the voltage at the first terminal of the second electronic switch, the voltage of the third resistor, and a voltage of the first diode, and the current of the third terminal of the first electronic switch is approximately equal to a current of the fifth resistor.

10. The load-testing circuit of claim 9, further comprising a third current branch circuit comprising:
  a sixth resistor;
  a second diode comprising an anode and a cathode electrically connected to the first terminal of the second electronic switch through the third resistor;
  a third diode comprising an anode and a cathode electrically connected to the anode of the second diode;
  a fifth switch comprising a first terminal and a second terminal electrically connected to the anode of the third diode; and
  a third relay comprising:
    a third coil comprising a first terminal electrically connected to the third terminal of the first electronic switch, and a second terminal electrically connected to the first terminal of the fifth switch, and
    a sixth switch comprising a first terminal electrically connected to the third terminal of the first electronic switch, and a second terminal grounded through the sixth resistor;
wherein in response to the fifth switch being turned on, the third current branch circuit is activated, the second diode and the third diode are turned on, a current passes through the third coil, the sixth switch is turned on, a voltage at the third terminal of the first electronic switch is supplied to the first terminal of the second electronic switch through the third coil, the fifth switch, the third diode, the second diode, and the third resistor in that order to turn on the second electronic switch, a voltage of the sixth resistor is approximately equal to a sum of the voltage at the first terminal of the second electronic switch, the voltage of the third resistor, a voltage of the second diode, and a voltage of the third diode, and the current of the third terminal of the first electronic switch is approximately equal to a current of the sixth resistor.

11. The load-testing circuit of claim 9, further comprising a fourth current branch circuit comprising:
  a seventh resistor;
  a fourth diode comprising an anode and a cathode electrically connected to the first terminal of the second electronic switch through the third resistor;
  a fifth diode comprising an anode and a cathode electrically connected to the anode of the fourth diode;
  a sixth diode comprising an anode and a cathode electrically connected to the anode of the fifth diode
  a seventh switch comprising a first terminal and a second terminal electrically connected to the anode of the sixth diode; and
  a fourth relay comprising:
    a fourth coil comprising a first terminal electrically connected to the third terminal of the first electronic switch, and a second terminal electrically connected to the first terminal of the seventh switch, and
    an eighth switch comprising a first terminal electrically connected to the third terminal of the first electronic switch, and a second terminal grounded through the seventh resistor;
  wherein in response to the seventh switch being turned on, the fourth current branch circuit is activated, the fourth diode, the fifth diode, and the sixth diode are turned on, a current passes through the fourth coil, the eighth switch is turned on, a voltage at the third terminal of the first electronic switch is supplied to the first terminal of the second electronic switch through the fourth coil, the seventh switch, the sixth diode, the fifth diode, the fourth diode, and the third resistor in that order to turn on the second electronic switch, a voltage of the seventh resistor is approximately equal to a sum of the voltage at the first terminal of the second electronic switch, the voltage of the third resistor, a voltage of the fourth diode, a voltage of the fifth diode, and a voltage of the sixth diode, and the current of the third terminal of the first electronic switch is approximately equal to a current of the seventh resistor.

12. The load-testing circuit of claim 11, wherein the fourth current branch circuit further comprises a seventh diode comprising an anode electrically connected to the second terminal of the fourth coil and a cathode electrically connected to the first terminal of the fourth coil, the seventh diode discharges electrical energy stored in the fourth coil.

13. The load-testing circuit of claim 10, wherein the third current branch circuit further comprises an eighth diode comprising an anode electrically connected to the second terminal of the third coil and a cathode electrically connected to the first terminal of the third coil, the eighth diode discharges electricity energy storied in the third coil.

14. The load-testing circuit of claim 9, wherein the first current branch circuit further comprises an ninth diode comprising an anode electrically connected to the second terminal of the first coil and a cathode electrically connected to the first terminal of the first coil, the ninth diode discharges electricity energy storied in the first coil; the second current branch circuit further comprises an tenth diode comprising an anode electrically connected to the second terminal of the second coil and a cathode electrically connected to the first terminal of the second coil, the tenth diode discharges electricity energy storied in the second coil.

15. The load-testing circuit of claim 9, wherein each of the first electronic switch and the second electronic switch is an npn-type bipolar junction transistor (BJT), and the first terminal, the second terminal, and the third terminal of each of the first electronic switch and the second electronic switch respectively correspond to a base, a collector, and an emitter of the npn-type BJT.

16. The load-testing circuit of claim 9, wherein each of the first resistor and the third resistor is a current-limiting resistor, and the second resistor is a voltage-dividing resistor.

* * * * *